(12) United States Patent
Jin et al.

(10) Patent No.: US 11,564,319 B2
(45) Date of Patent: Jan. 24, 2023

(54) METHOD OF MANUFACTURING CURVED-SURFACE METAL LINE

(71) Applicant: LOTES CO., LTD, Keelung (TW)

(72) Inventors: Zuo Feng Jin, Keelung (TW); Chien Hung Ho, Keelung (TW)

(73) Assignee: LOTES CO., LTD, Keelung (TW)

( * ) Notice: Subject to any disclaimer, the term of this patent is extended or adjusted under 35 U.S.C. 154(b) by 450 days.

(21) Appl. No.: 16/777,990

(22) Filed: Jan. 31, 2020

(65) Prior Publication Data
US 2020/0296838 A1    Sep. 17, 2020

(30) Foreign Application Priority Data

Mar. 15, 2019  (CN) .......................... 201910196329.2

(51) Int. Cl.
*G03F 7/20* (2006.01)
*H05K 3/06* (2006.01)
(Continued)

(52) U.S. Cl.
CPC ............. *H05K 3/06* (2013.01); *G03F 7/0002* (2013.01); *G03F 7/16* (2013.01); *G03F 7/20* (2013.01);
(Continued)

(58) Field of Classification Search
CPC . G03F 7/18; G03F 7/0002; G03F 7/20; G03F 7/30
See application file for complete search history.

(56) References Cited

U.S. PATENT DOCUMENTS

| | | | | |
|---|---|---|---|---|
| 4,840,654 A | * | 6/1989 | Pryor | .................... C03C 14/004 65/17.6 |
| 2015/0048048 A1 | * | 2/2015 | Slafer | ..................... B29C 41/38 216/26 |

FOREIGN PATENT DOCUMENTS

| | | | | |
|---|---|---|---|---|
| CN | 102292252 | * | 1/2013 | ............... H05K 3/00 |
| CN | 103124470 A | | 5/2013 | |

(Continued)

OTHER PUBLICATIONS

English Translation of CN 102292252, Hu et al., "Manufacturing Method Of Three-dimensional Circuit". (Year: 2013).*

*Primary Examiner* — Daborah Chacko-Davis
(74) *Attorney, Agent, or Firm* — Locke Lord LLP; Tim Tingkang Xia, Esq.

(57) ABSTRACT

A method of manufacturing a curved-surface metal line is provided. A three-dimensional structure is formed with a metal member and then fixed together with an insulator. Alternatively, the metal member and the insulator are embedded-formed to jointly form the three-dimensional structure, or the metal member and the insulator are fixed together and then jointly form the three-dimensional structure. Then, a photoresist protection layer is formed outside the metal member, and a selective exposure treatment is performed such that corresponding locations of the photoresist protection layer being exposed is subject to a photochemical reaction. The photoresist protection layer is developed, and after the photoresist protection layer is partially dissolved, portions of the metal member at the corresponding locations are simultaneously exposed. The exposed portions of the metal member are etched, and residual portions of the photoresist protection layer are removed to form the metal line provided on the insulator.

12 Claims, 20 Drawing Sheets

(51) Int. Cl.
*H05K 3/46* (2006.01)
*H05K 3/00* (2006.01)
*G03F 7/30* (2006.01)
*G03F 7/00* (2006.01)
*G03F 7/16* (2006.01)
*H05K 1/02* (2006.01)

(52) U.S. Cl.
CPC ............ *G03F 7/30* (2013.01); *H05K 1/0284* (2013.01); *H05K 3/0044* (2013.01); *H05K 3/4644* (2013.01)

(56) References Cited

FOREIGN PATENT DOCUMENTS

| | | |
|---|---|---|
| CN | 202927509 U | 5/2013 |
| CN | 104934697 A | 9/2015 |
| TW | 201332407 A | 8/2013 |

* cited by examiner

METHOD OF MANUFACTURING CURVED-SURFACE METAL LINE

CROSS-REFERENCE TO RELATED PATENT APPLICATION

This non-provisional application claims priority to and the benefit of, pursuant to 35 U.S.C. § 119(a), patent application Serial No. CN201910196329.2 filed in China on Mar. 15, 2019. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a method of manufacturing a curved-surface metal line, and particularly to a manufacturing method of forming a curved-surface metal line on an insulator with a three-dimensional structure.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Currently, with the development of electronic products towards high functionalities, lightness and thinness, related electronic products increasingly focus on meeting light, thin, short, small and multifunctional needs. However, for different electronic products (such as antennas and illuminating lamps), different three-dimensional line structures need to be designed according to different product appearances and internal structures, thereby meeting the miniaturization need of the electronic products.

In the existing technology, a flexible base membrane is provided, a preset metal line is printed or screen-printed on the flexible base membrane, and electronic components are mounted on the metal line. Then, a hot forming process is performed to obtain the three-dimensional curved structure being required. Finally, the metal line and an insulation shell are formed by injection-molding so as to form a metal line with a specific curved structure. The technology is often applied to products such as antennas and illuminating lamps.

However, according to the method of the manufacturing three-dimensional metal line, the specific metal line structure is firstly formed, and then the specific metal line structure and the insulation shell are formed by injection-molding. Due to complicated and diversified shapes of the metal line, when the metal line and the insulation shell are formed by injection-molding, even if the metal line is positioned by the mold, in the process that the flowing plastic is injected into a mold, the metal line is still easily deformed by impact of the flowing plastic, such that the metal line being finally manufactured is inaccurate. If the impact force is too large, damage and breakage may occur, thereby affecting the reliability of the metal line.

Therefore, a heretofore unaddressed need to design a new method of manufacturing a curved-surface metal line exists in the art to address the aforementioned deficiencies and inadequacies.

SUMMARY

The present invention is directed to a method of manufacturing a curved-surface metal line, by fixing a metal member and an insulator together and then forming the metal line on a surface of the insulator, such that the metal line does not deform by pulling due to combining and fixing of the insulator and the metal member. The method can be used to obtain the metal line with good reliability and high accuracy.

To achieve the foregoing objective, the present invention adopts the following technical solutions.

A method of manufacturing a curved-surface metal line includes: (1) providing a metal member; (2) processing the metal member to form a three-dimensional structure; (3) fixing an insulator to the metal member; (4) forming a photoresist protection layer outside the metal member; (5) performing a selective exposure treatment on the photoresist protection layer, such that corresponding locations of the photoresist protection layer being exposed is subject to a photochemical reaction; (6) developing the photoresist protection layer, wherein after the photoresist protection layer is partially dissolved, portions of the metal member at the corresponding locations of the photoresist protection layer are simultaneously exposed; (7) etching the exposed portions of the metal member; and (8) removing residual portions of the photoresist protection layer to form the metal line provided on the insulator.

In certain embodiments, in the steps (1) and (2), the metal member is a copper foil, and the metal member is formed as the three-dimensional structure by stamping.

In certain embodiments, after the step (8), the metal line has a first metal wire and a second metal wire, the metal line is electrically connected to a plurality of electronic components respectively, and each of the electronic components is connected to the first metal wire and the second metal wire.

In certain embodiments, after the step (8), a shell is formed by being embedded with the metal line and the insulator.

A method of manufacturing a curved-surface metal line includes: (1) providing a metal member; (2) embedded-forming the metal member and an insulator to jointly form a three-dimensional structure; (3) forming a photoresist protection layer outside the metal member; (4) performing a selective exposure treatment on the photoresist protection layer, such that corresponding locations of the photoresist protection layer being exposed is subject to a photochemical reaction; (5) developing the photoresist protection layer, wherein after the photoresist protection layer is partially dissolved, portions of the metal member at the corresponding locations of the photoresist protection layer are simultaneously exposed; (6) etching the exposed portions of the metal member; and (7) removing residual portions of the photoresist protection layer to form the metal line provided on the insulator.

In certain embodiments, after the step (7), the metal line has a first metal wire and a second metal wire, the metal line is electrically connected to a plurality of electronic components respectively, and each of the electronic components is connected to the first metal wire and the second metal wire.

In certain embodiments, after the step (7), a shell is formed by being embedded with the metal line and the insulator.

A method of manufacturing a curved-surface metal line includes: (1) providing a metal member; (2) fixing an insulator to the metal member; (3) making the metal member and the insulator to jointly form a three-dimensional structure; (4) forming a photoresist protection layer outside the metal member; (5) performing a selective exposure treatment on the photoresist protection layer, such that corresponding locations of the photoresist protection layer being exposed is subject to a photochemical reaction; (6) developing the photoresist protection layer, wherein after the photoresist protection layer is partially dissolved, portions of the metal member at the corresponding locations of the photoresist protection layer are simultaneously exposed; (7) etching the exposed portions of the metal member; and (8) removing residual portions of the photoresist protection layer to form the metal line provided on the insulator.

In certain embodiments, in the step (2), the insulator is adhered or injection-molded to the metal member.

In certain embodiments, in the step (3), the metal member and the insulator jointly form the three-dimensional structure by stamping or hot pressing.

In certain embodiments, after the step (8), the metal line has a first metal wire and a second metal wire, the metal line is electrically connected to a plurality of electronic components respectively, and each of the electronic components is connected to the first metal wire and the second metal wire.

In certain embodiments, after the step (8), a shell is formed by being embedded with the metal line and the insulator.

Compared with the related art, the method according to certain embodiments of the present invention has the following beneficial effects.

A three-dimensional structure is firstly formed with a metal member and then fixed together with an insulator. Alternatively, the metal member and the insulator are embedded-formed to jointly form the three-dimensional structure. Alternatively, the metal member and the insulator are firstly fixed together and then jointly form the three-dimensional structure. Then, a series of steps of applying photoresist, performing exposure and development, etching, and removing the layer are performed to obtain the metal line. That is, in all cases, the metal member is firstly fixed on the insulator, and then the metal line is formed on the surface of the insulator. Since the metal line is not formed when the metal member and the insulator are fixed together, when the insulator is subject to injection-molding or adhesion, the insulator does not cause impact and pulling on the final metal line, and deformation, damage or breakage thereof are thus avoided. Therefore, the metal line being finally manufactured is accurate.

Furthermore, since the metal member is firstly fixed on the insulator, in the subsequent procedures of manufacturing the metal line, the insulator supports the metal member, such that the metal member is positioned accurately, and the metal line being finally manufactured has good reliability and high accuracy.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
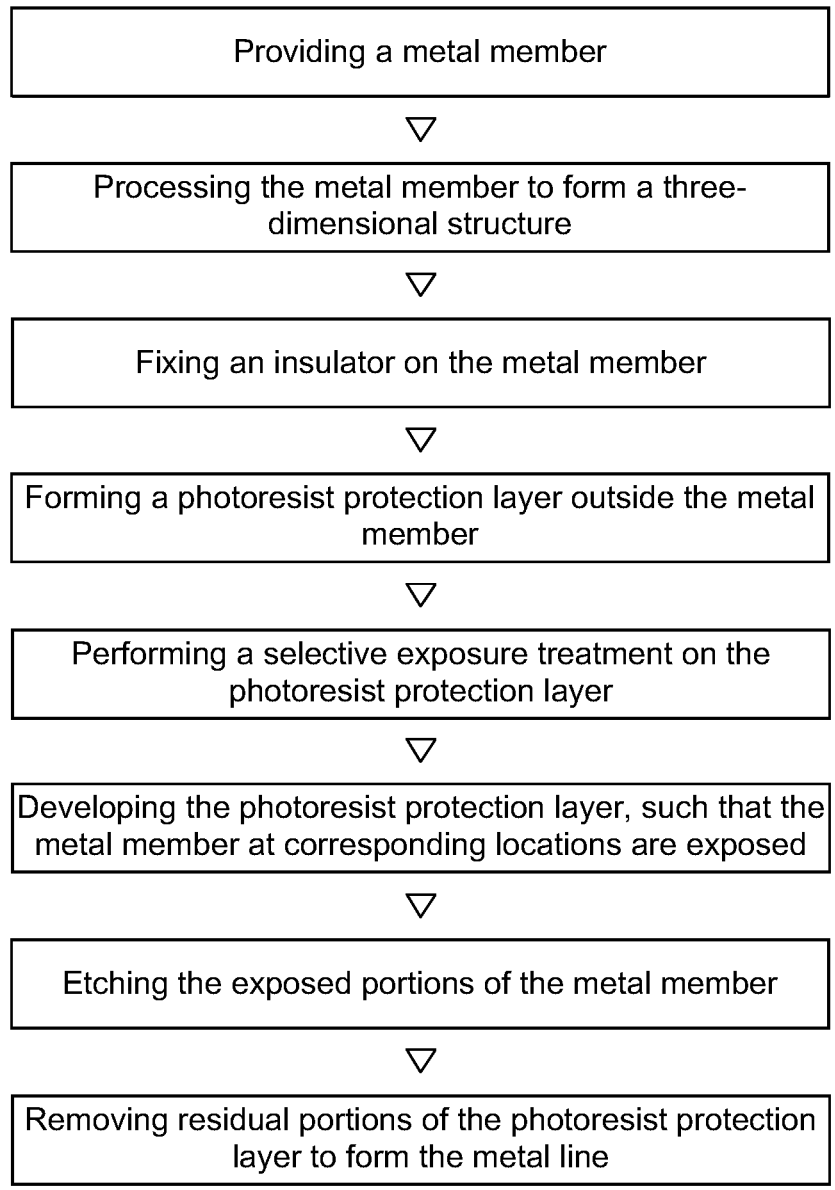
FIG. 1 is a flowchart of a method of manufacturing a curved-surface metal line according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-20. In accordance with the purposes of this invention, as embodied and broadly described herein, this invention, in one aspect, relates to a method of manufacturing a curved-surface metal line.

Figure 2:
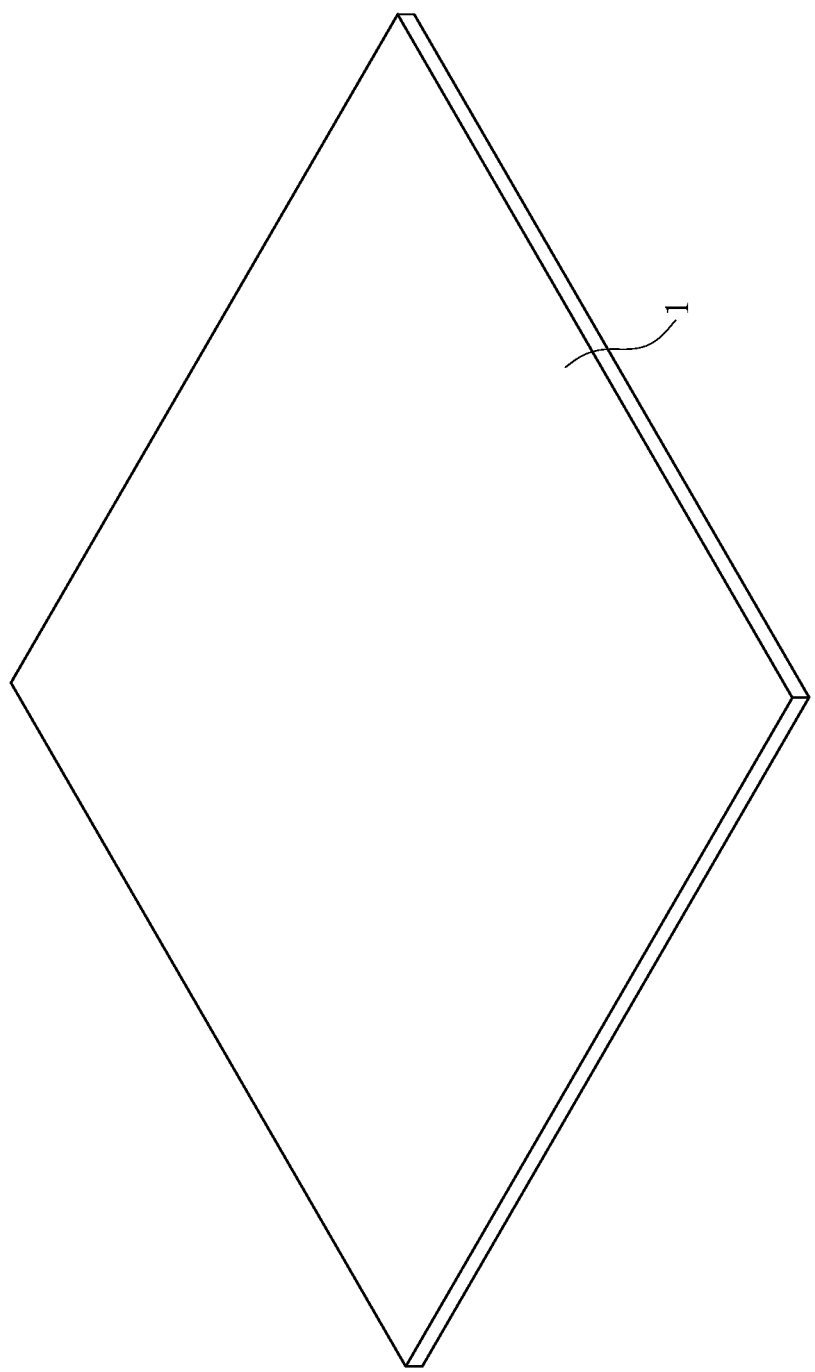
FIG. 2 is a schematic structural view of providing a metal member in the method according to the first embodiment of the present invention.

Referring to the flowchart as shown in FIG. 1 as well as the schematic views of the steps of the method as shown in FIG. 2 to FIG. 13, a method of manufacturing a curved-surface metal line according to a first embodiment of the present invention includes the following step:

As shown in FIG. 2, in step (1), a metal member 1 is provided. The metal member 1 is a metal sheet, and the metal member 1 can be selected from copper foil.

Figure 3:
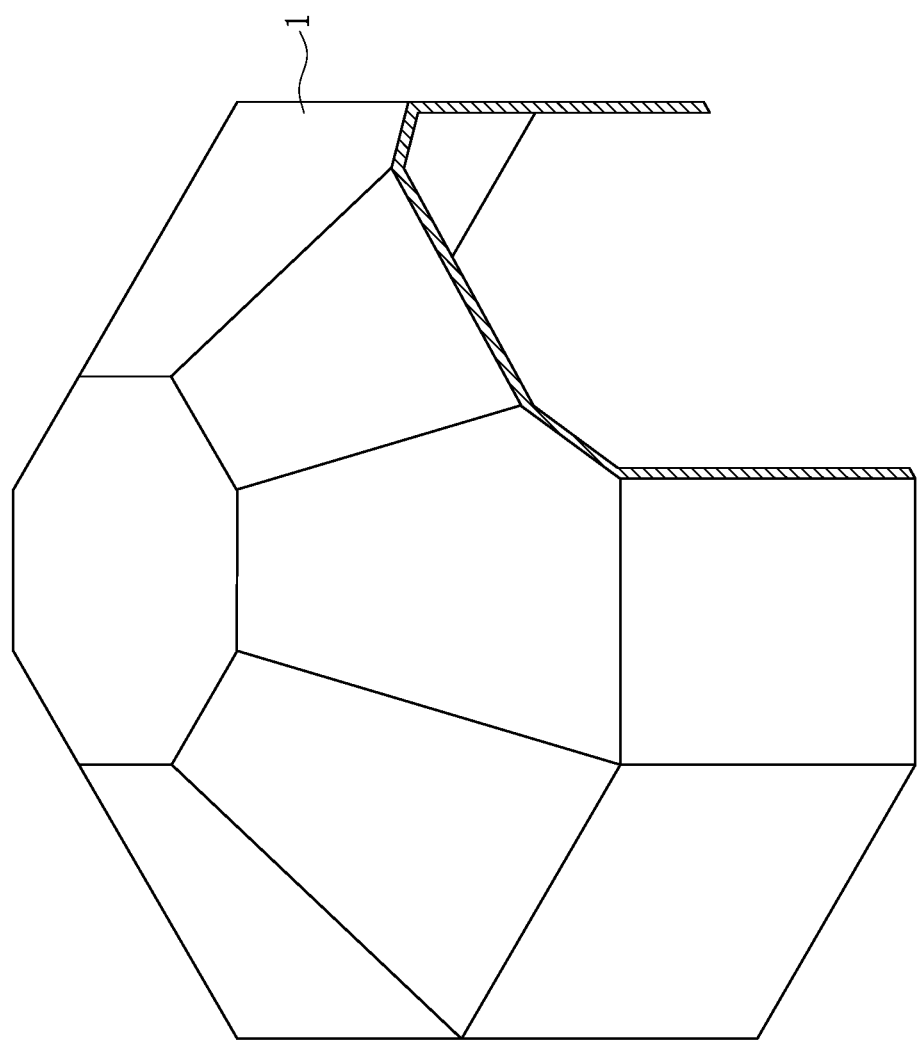
FIG. 3 is a schematic view of forming a three-dimensional structure with a metal member in the method according to the first embodiment of the present invention.

As shown in FIG. 3, in step (2), the metal member 1 is processed to form a three-dimensional structure. The metal member 1 is formed as the three-dimensional structure by stamping.

Figure 4:
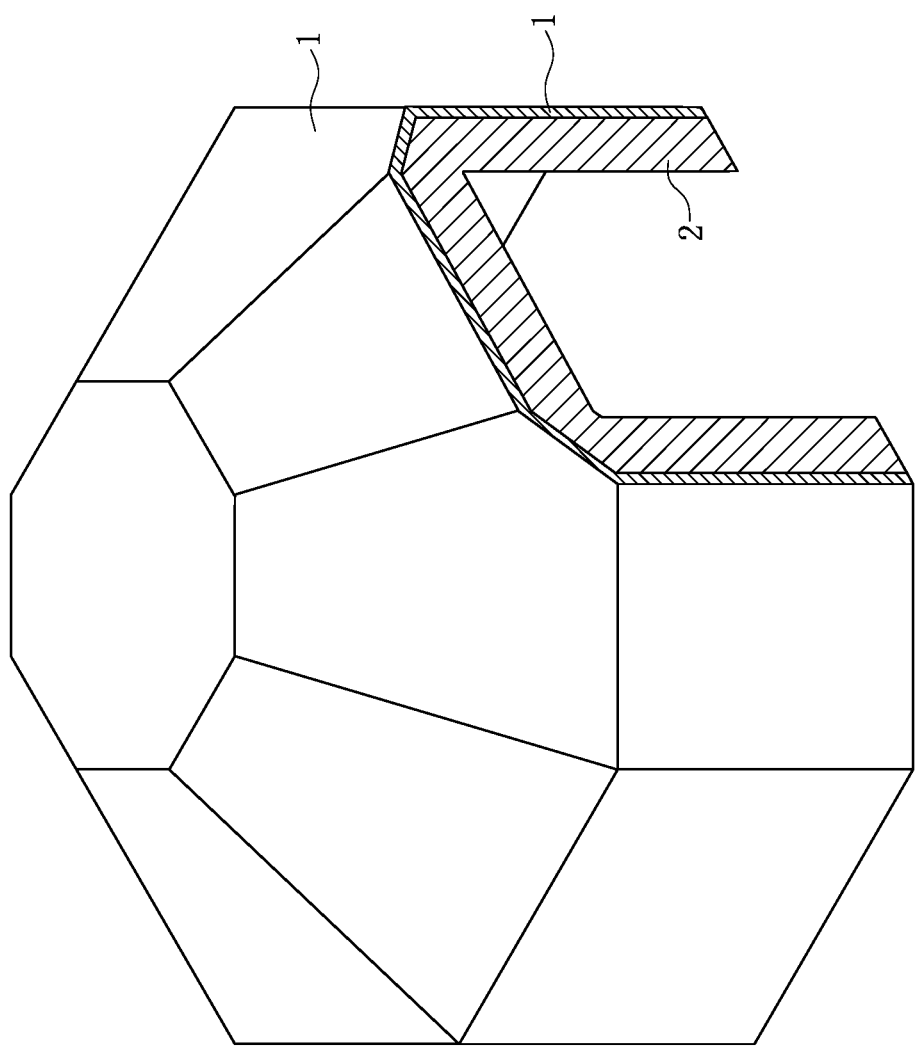
FIG. 4 is a schematic structural view of fixing an insulator to the metal member in the method according to the first embodiment of the present invention.

As shown in FIG. 4, in step (3), an insulator 2 is fixed to the metal member 1. The insulator 2 can be firstly formed into a three-dimensional structure matched with the metal member 1 by ejection or extrusion molding, and then be adhered to the surface of the metal member 1. The insulator 2 can also be directly embedded-formed on the metal member 1. The insulator 2 can be selected from one of polyethylene (PE), polystyrene (PS), polycarbonate (PC), acrylonitrile-butadiene-styrene copolymer (ABS), polyethylene terephthalate (PET), polybutylene terephthalate (PBT), liquid crystal polymer (LCP), polyamide (PA6/6T), nylon, copolyoxymethylene (POM), polypropylene (PP), and laminated or ejected glass-fiber. Between the step (2) and the step (3), the metal member 1 needs to be subject to a surface treatment. The surface treatment includes surface degreasing and surface roughening. In the procedure of surface degreasing, an acidic or alkaline cleaning agent is used for removing dirt and grease on the surface of the metal member 1, such that the surface of the metal member 1 is cleaner. In the procedure of surface roughening, one of mechanical rubbing, sand blasting, chemical etching or plasma treatment is used for performing roughening treatment to a certain extent so as to change the roughness of the surface of the metal member 1 and improve the adhesion force between the insulator 2 and the metal member 1.

Figure 5:
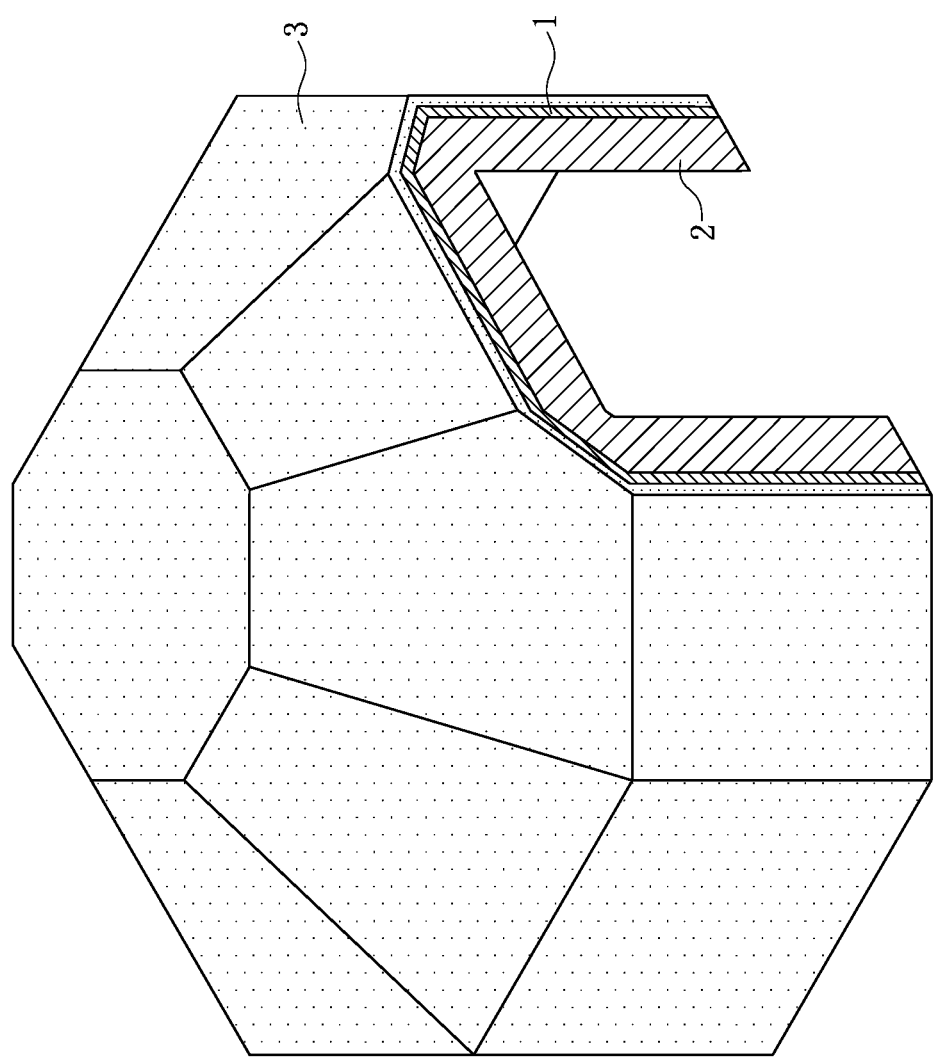
FIG. 5 is a schematic structural view of forming a photoresist protection layer outside a metal member in the method according to the first embodiment of the present invention.

As shown in FIG. 5, in step (4), a photoresist protection layer 3 is formed outside the metal member 1. The photoresist protection layer 3 is formed by coating the surface of the metal member 1 with a photosensitive liquid photoresist using dip coating, spray printing, transfer printing, brush coating or spray coating. In spray printing, an ink gun is used for spray printing the photosensitive liquid photoresist to the surface of the metal member 1 so as to form the photoresist protection layer 3 with a three-dimensional line pattern. In transfer printing, a transfer printing rubber head is used for dipping the photosensitive liquid photoresist to the surface of the metal member 1 so as to form the photoresist protection layer 3 with a three-dimensional line pattern. The photosensitive liquid photoresist of the photoresist protection layer 3 is selected from one of a positive photoresist and a negative photoresist.

Figure 6:
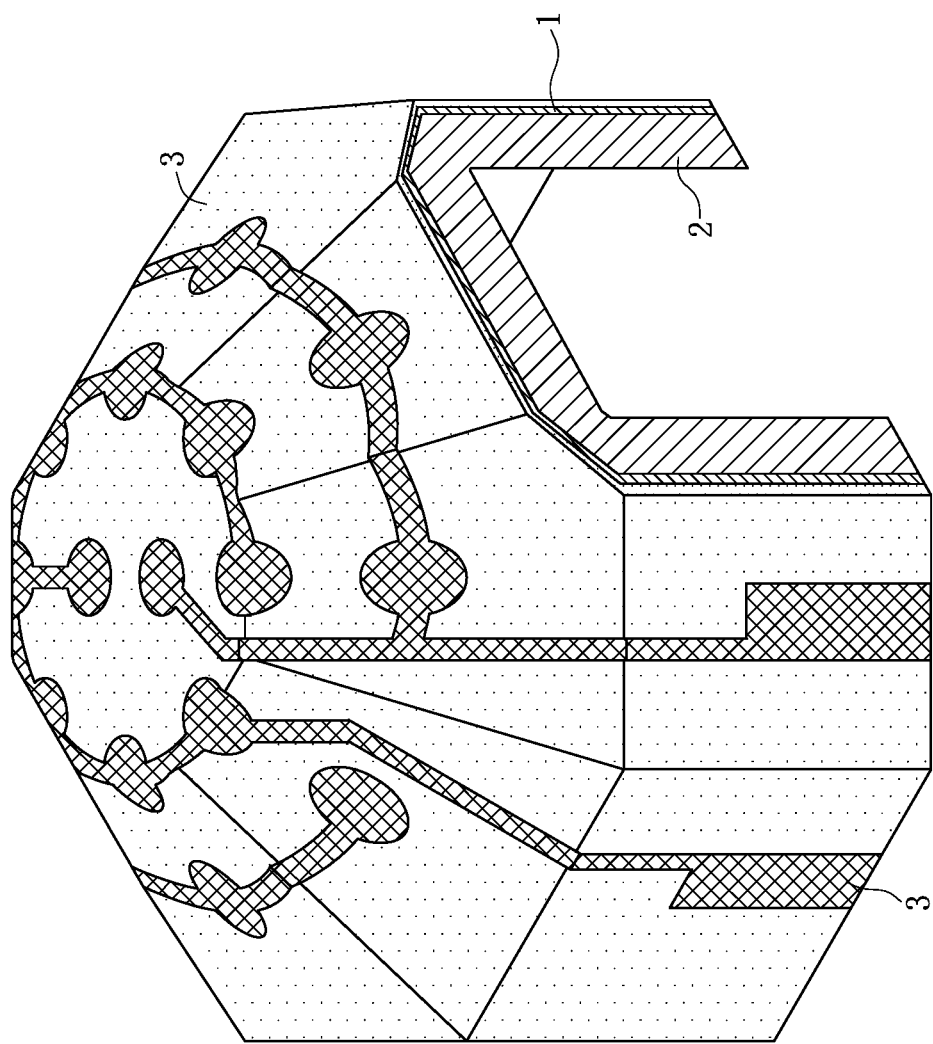
FIG. 6 is a schematic structural view of performing an exposure treatment on the photoresist protection layer in the method according to the first embodiment of the present invention.

As shown in FIG. 6, in step (5), the photoresist protection layer 3 is performed with to a selective exposure treatment such that corresponding locations of the photoresist protection layer 3 being exposed is subject to a photochemical reaction. The exposure treatment adopts one of single-sided exposure and double-sided exposure. In the procedure of exposure treatment, a laser light source or an ultraviolet light source is used for directly irradiating the photoresist protection layer 3 according to a region or position of a specific three-dimensional exposure line pattern. The three-dimensional exposure line pattern is selected from one of a three-dimensional photomask, a transfer printing line pattern and a direct scanning pattern. The three-dimensional photomask is selected from one of metal, plastic or silica gel materials, which has a light-transmitting opening with a specific line pattern, and serves as a three-dimensional line pattern photomask for the selective exposure. In this embodiment, single-sided exposure is adopted, and the negative photoresist is selected as the photosensitive liquid photoresist. In other embodiments, the positive photoresist can be selected as the photosensitive liquid photoresist of the photoresist protection layer 3. The photoresist protection layer 3 is selectively exposed to form a predetermined exposure pattern, such that corresponding locations of the photoresist protection layer 3 being exposed is subject to a photochemical reaction.

Figure 7:
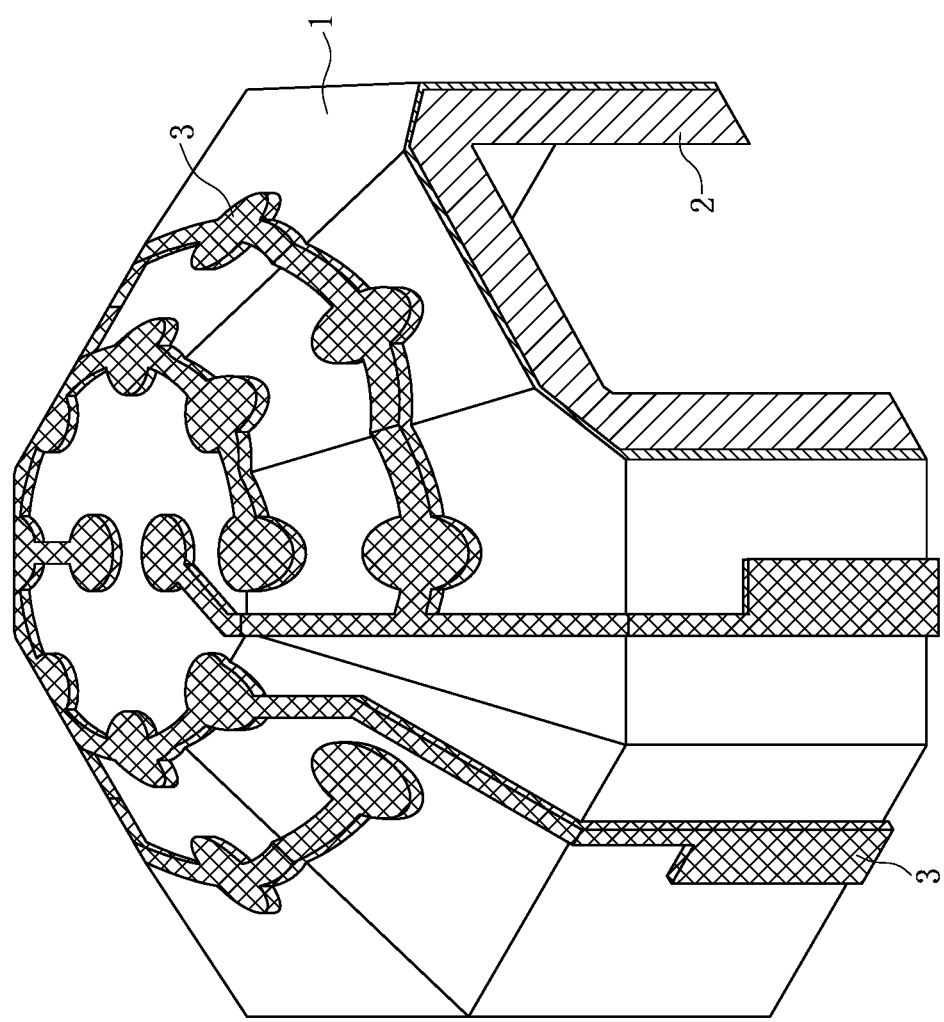
FIG. 7 is a schematic structural view of developing the photoresist protection layer in the method according to the first embodiment of the present invention.

As shown in FIG. 7, in step (6), the photoresist protection layer 3 is developed. After the photoresist protection layer 3 is partially dissolved, portions of the metal member 1 at the corresponding locations of the photoresist protection layer 3 are simultaneously exposed. In the developing procedure, spraying or soaking of a developing agent is performed for dissolving and removing the photoresist protection layer 3 in partial regions, and the metal member 1 at the corresponding locations are simultaneously exposed. In this embodiment, the photoresist protection layer 3 being exposed is subject to the photochemical reaction and is not dissolved in the developing agent, and the photoresist protection layer 3 being unexposed is dissolved in the developing agent and is thus removed.

Figure 8:
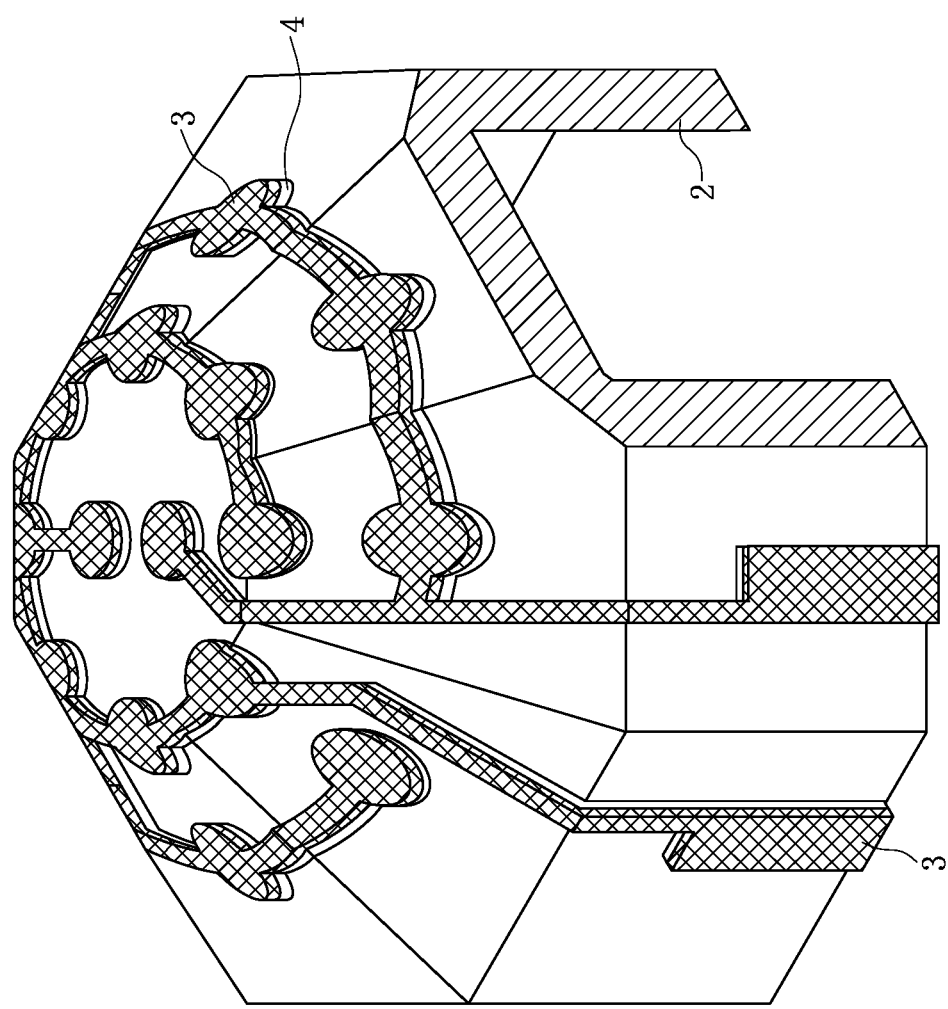
FIG. 8 is a schematic structural view of etching the metal member in the method according to the first embodiment of the present invention.

As shown in FIG. 8, in step (7), the exposed portions of the metal member 1 are etched. The etching treatment adopts one of spraying or soaking an etching agent. The exposed portions of the metal member 1 are etched and removed by an etching solution, and the other portions of the metal member 1 covered with the photoresist protection layer 3 are not etched and removed by the etching solution, thus directly forming a metal line 4 covered with the photoresist protection layer 3.

Figure 9:
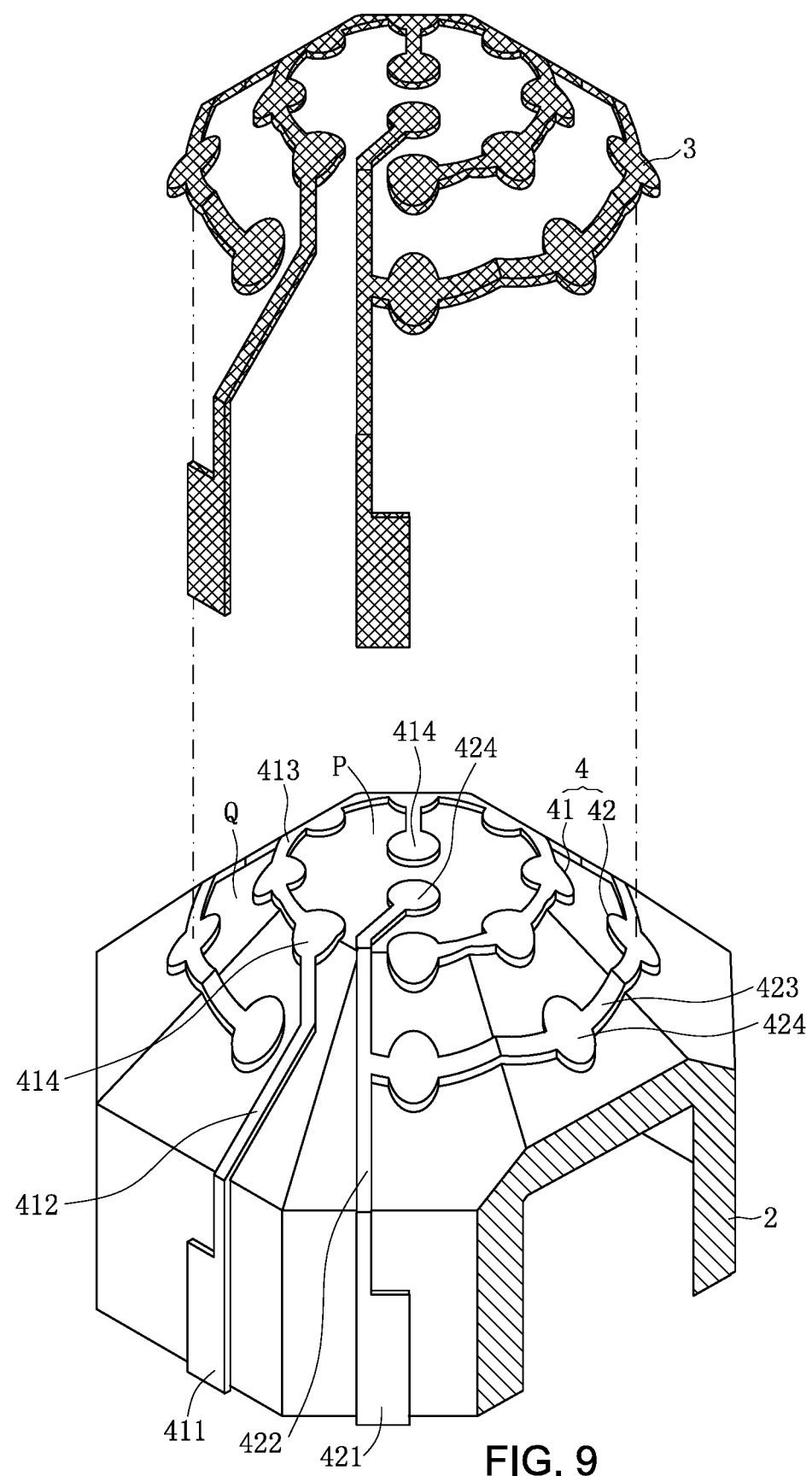
FIG. 9 is a schematic perspective exploded view of the photoresist protection layer and the metal layer in FIG. 8.
Figure 10:
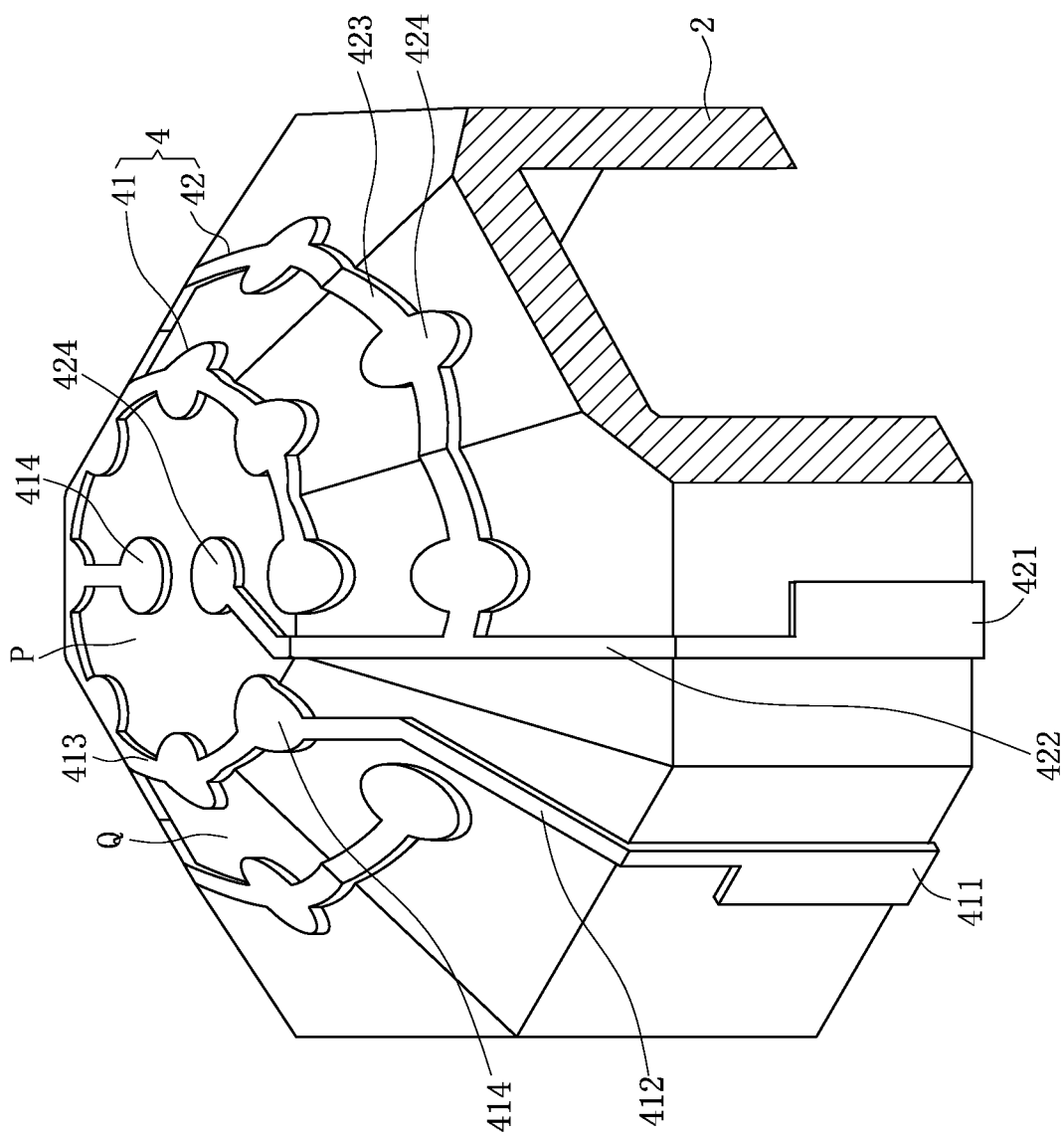
FIG. 10 is a schematic structural view of removing the photoresist protection layer to form a metal line in the method according to the first embodiment of the present invention.

As shown in FIG. 9 and FIG. 10, in step (8), the residual portions of the photoresist protection layer 3 are removed to expose the metal line 4 provided on the insulator 2. The removing treatment can adopt one of spraying or soaking a stripping agent. The photoresist protection layer 3 covering the metal line 4 is completely removed by the stripping agent such that the metal line 4 is exposed.

Figure 11:
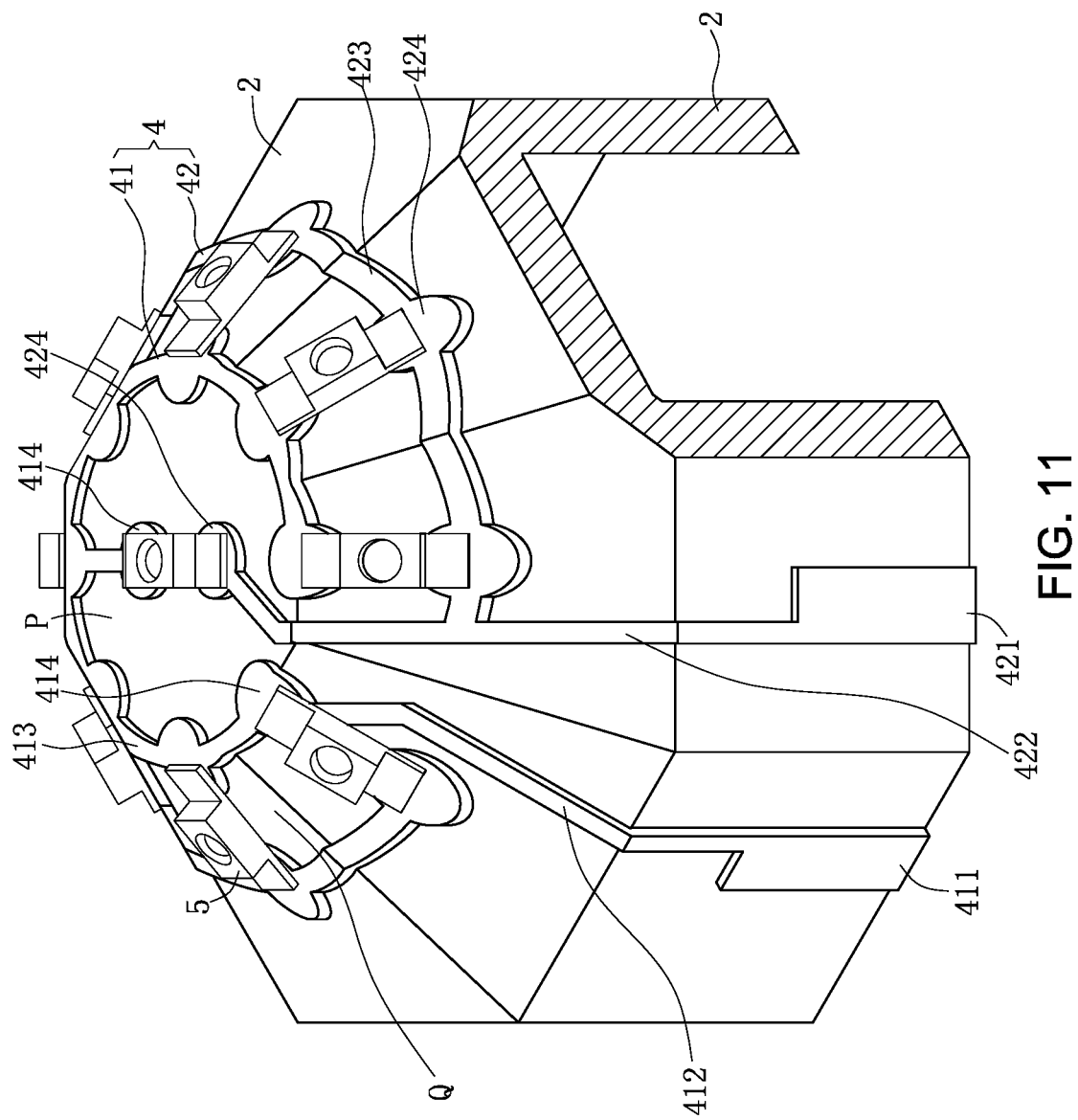
FIG. 11 is a schematic perspective structural view of mounting electronic components on a metal line in the method according to the first embodiment of the present invention.
Figure 12:
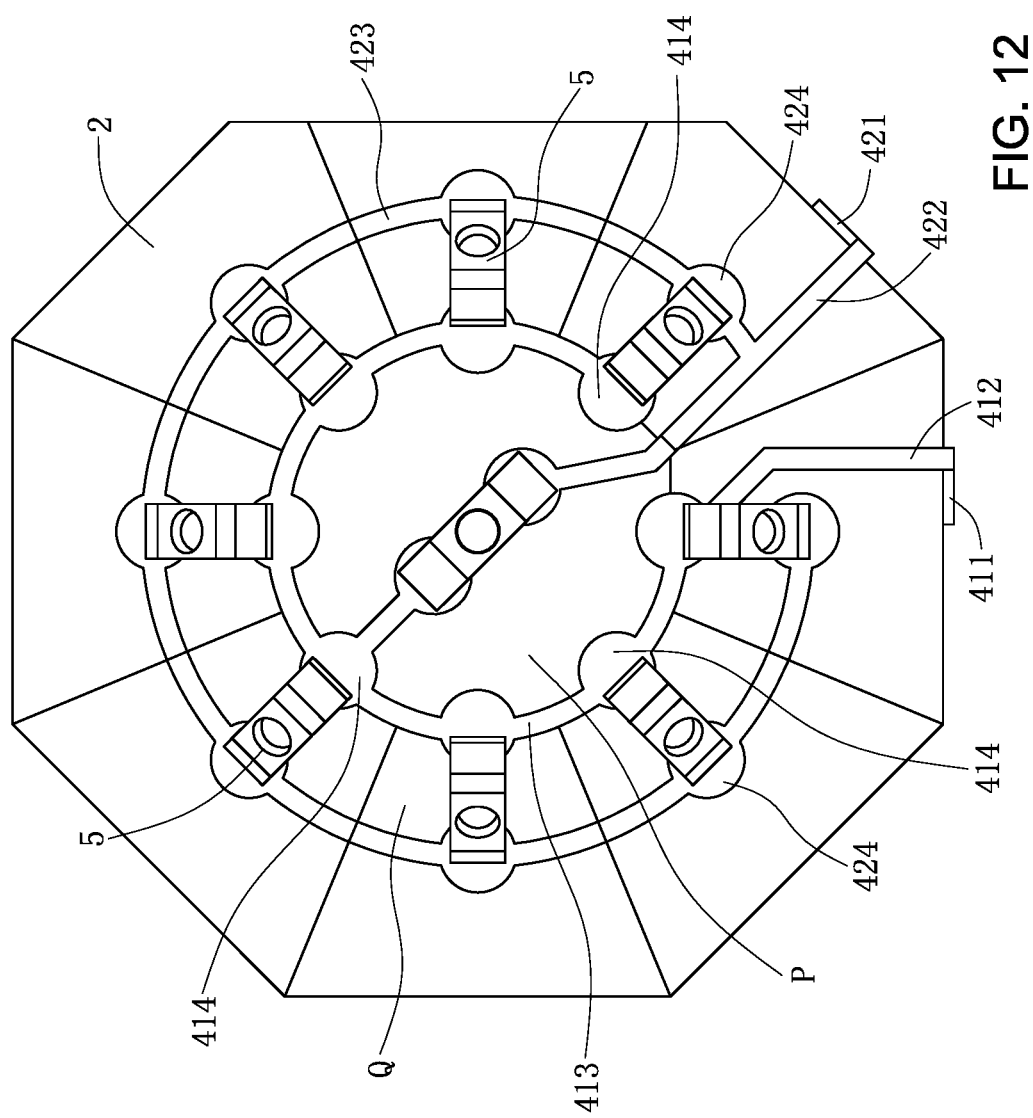
FIG. 12 is a top view of FIG. 11.

As shown in FIG. 10 to FIG. 12, after the step (8), in this embodiment, the metal line 4 has a first metal wire 41 and a second metal wire 42. The first metal wire 41 has a first connecting portion 411 connected to a positive electrode of a terminal power supply portion, a first front section 412 extending upward from the first connecting portion 411, and a first rear section 413 extending backward extended from the first front section 412. The first rear section 413 encloses a first annular region P. The first rear section 413 is provided with a plurality of first connecting points 414 arranged at intervals, and the first connecting points 414 extend from a middle position of the first rear section 413 toward a center of the annular region, such that the space thereof is fully utilized. The second metal wire 42 has a second connecting portion 421 connected to the negative electrode of the terminal power supply portion, a second front section 422 extending upward from the second connecting portion 421, and a second rear section 423 extending from the second front section 422 toward one side thereof. The second rear section 423 encloses a second annular region Q. The second rear section 423 is provided with a plurality of second connecting points 424 corresponding to the first connecting points 414, and the second connecting points 424 extend from the second front section 422 toward the center of the first annular region P, such that the space thereof is fully utilized. The first rear section 413 and the second rear section 423 are arranged side by side, and the first annular region P is located at an inner side of the second annular region Q, such that the metal lines 4 can also achieve maximum densification without short-circuiting with each other.

Multiple electronic components 5 are electrically connected to the first metal wire 41 and the second metal wire 42 respectively. Each electronic component 5 correspondingly conductively connect a first connecting point 414 and a second connecting point 424. The electronic components 5 can be welded or riveted to the first connecting points 414 and the second connecting points 424, and each electronic component 5 may be a resistor, a capacitor, a chip, an LED lamp, or the like. In this embodiment, the electronic component 5 is the LED lamp. The first metal wire 41 and the second metal wire 42 in the three-dimensional structure are electrically connected to the electronic components 5 instead of a traditional circuit board, and conductive lines in different three-dimensional structures can be conveniently designed, such that the space thereof can be saved, and more aesthetical and small products can be produced.

Figure 13:
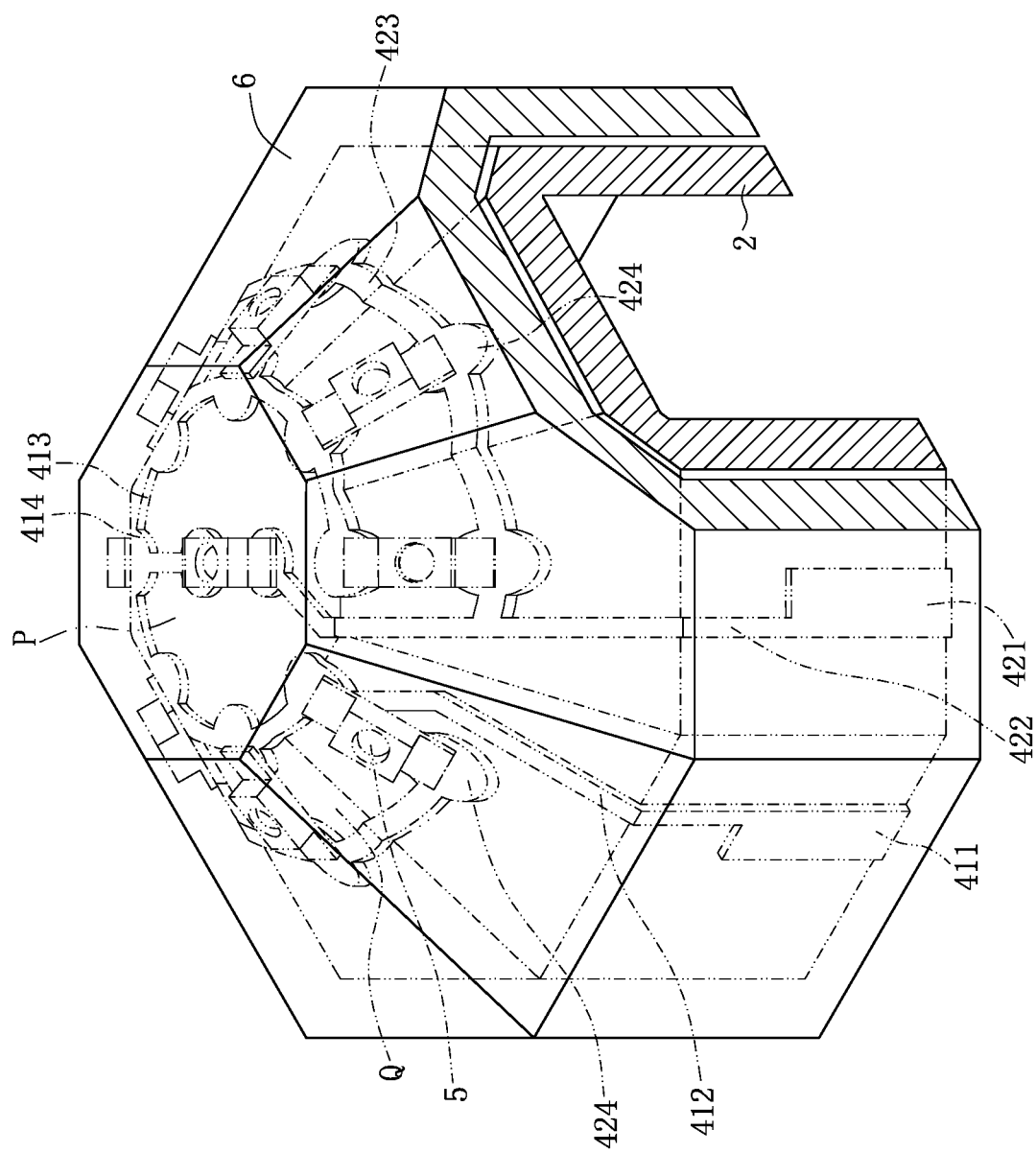
FIG. 13 is a schematic structural view of forming a shell by being embedded with the metal line and the insulator in the method according to the first embodiment of the present invention.

As shown in FIG. 13, after the step (8), a shell 6 is formed by being embedded with the metal line 4 and the insulator 2. Since the metal line 4 and the electronic components 5 are already fixed to the insulator 2, and an ejection rate of a mold during embedded-forming again is lower than the ejection rate at the first time, the damage rate of the metal line 4 is lower when the metal line 4 and the shell 6 are embedded-formed again. The shell 6 can be used for aesthetical, protective, insulating or other purposes. In this embodiment, the shell 6 is a colorless and transparent protection shell.

Figure 14:
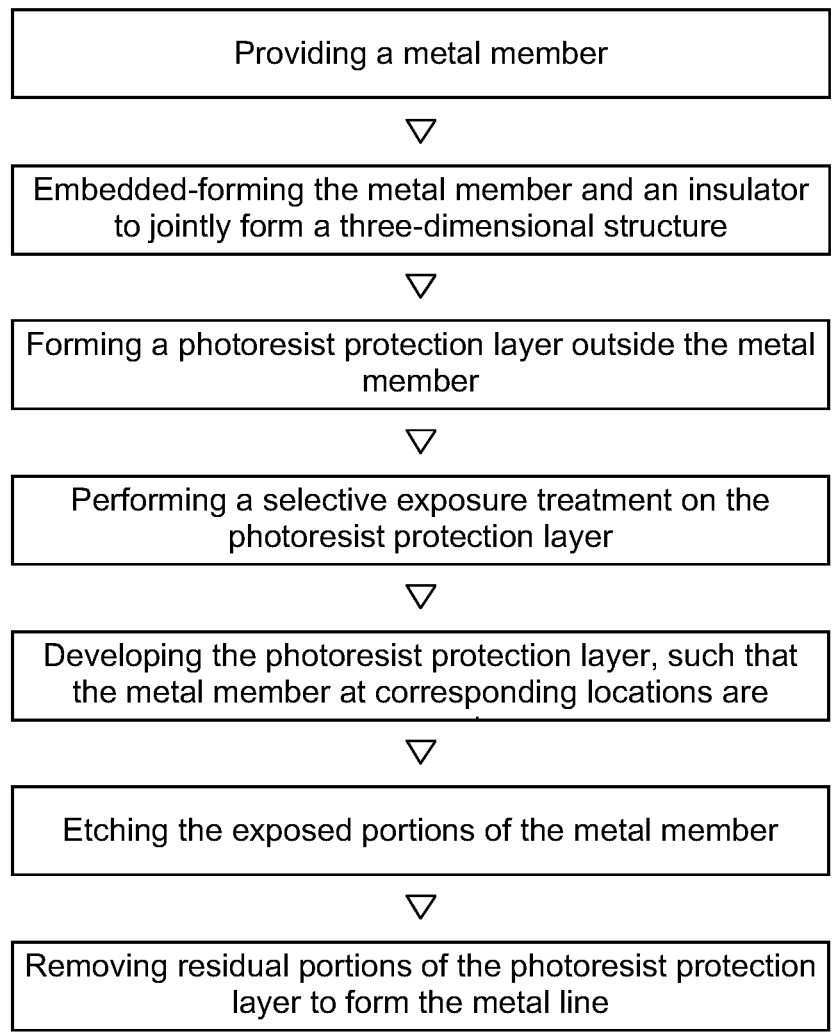
FIG. 14 is a flowchart of a method of manufacturing a curved-surface metal line according to a second embodiment of the present invention.
Figure 15:
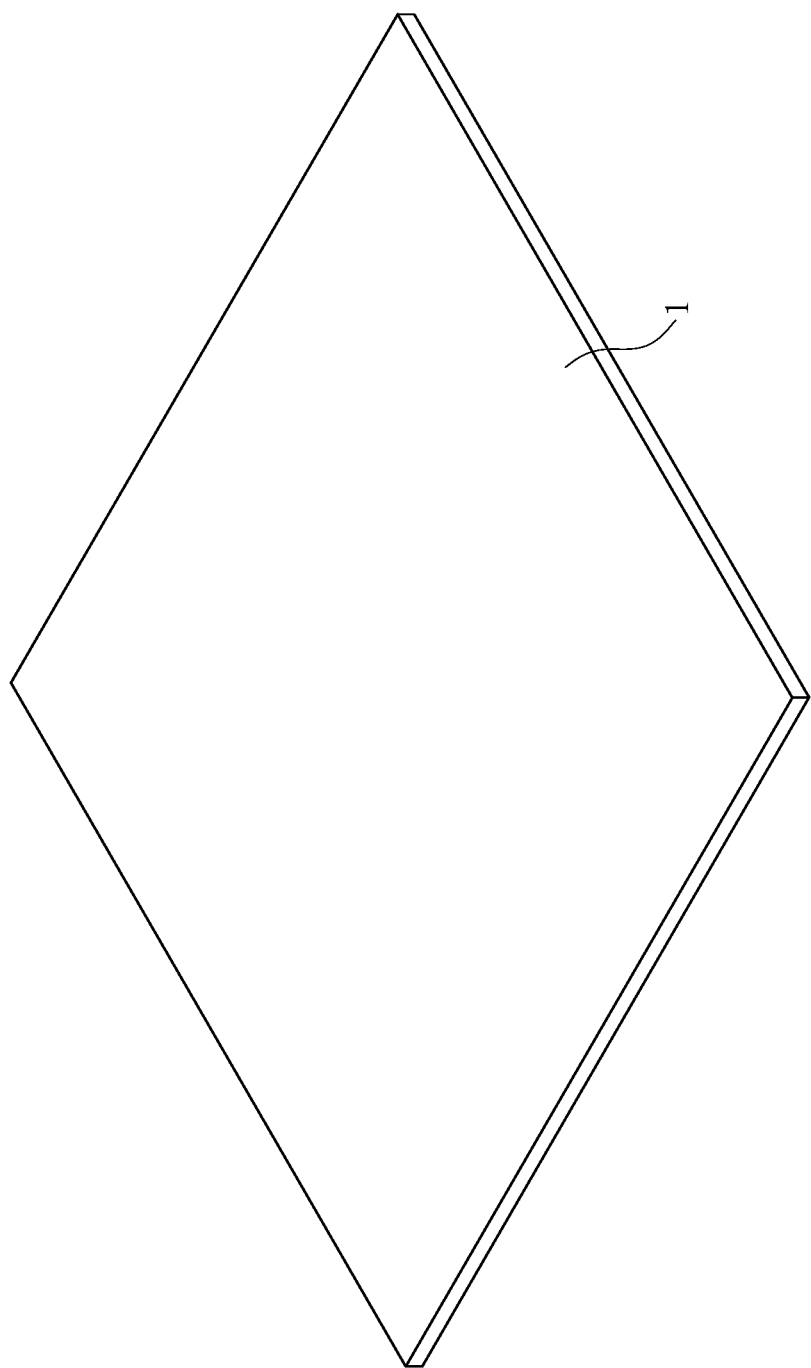
FIG. 15 is a schematic structural view of providing a metal member in the method according to the second embodiment of the present invention.

Referring to the flowchart as shown in FIG. 14 as well as the schematic views of the steps of the method as shown in FIG. 15, FIG. 16 and FIG. 5 to FIG. 13, a method of manufacturing a curved-surface metal line according to a second embodiment of the present invention includes the following step:

As shown in FIG. 15, in step (1), a metal member 1 is provided.

Figure 16:
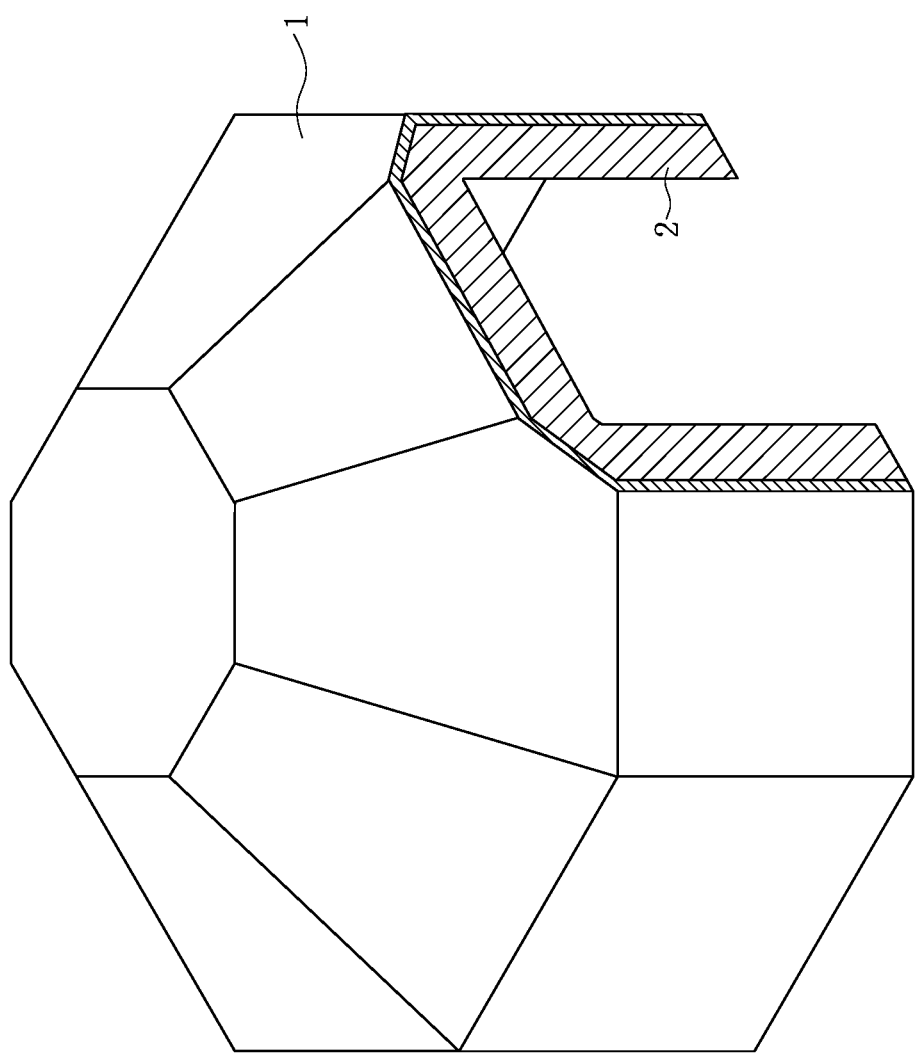
FIG. 16 is a schematic view of embedded-forming the metal member and an insulator to jointly form a three-dimensional structure in the method according to the second embodiment of the present invention.

As shown in FIG. 16, in step (2), the metal member 1 and an insulator 2 are embedded-formed to jointly form a three-dimensional structure. That is, when the insulator 2 is formed by injection-molding, the metal member 1 is put into a mold and is then assembled and ejected to form the metal member 1 coated with the insulator 2 in the three-dimensional structure.

As shown in FIG. 5, in step (3), a photoresist protection layer 3 is formed outside the metal member 1.

As shown in FIG. 6, in step (4), the photoresist protection layer 3 is performed with to a selective exposure treatment such that corresponding locations of the photoresist protection layer 3 being exposed is subject to a photochemical reaction.

As shown in FIG. 7, in step (5), the photoresist protection layer 3 is developed. After the photoresist protection layer 3 is partially dissolved, portions of the metal member 1 at the corresponding locations of the photoresist protection layer 3 are simultaneously exposed.

As shown in FIG. 8, in step (6), the exposed portions of the metal member 1 are etched.

As shown in FIG. 9 and FIG. 10, in step (7), the residual portions of the photoresist protection layer 3 are removed to form a metal line 4 on the insulator 2.

Other steps of the method which are the same as those in the method according to the first embodiment are not elaborated herein.

Figure 17:
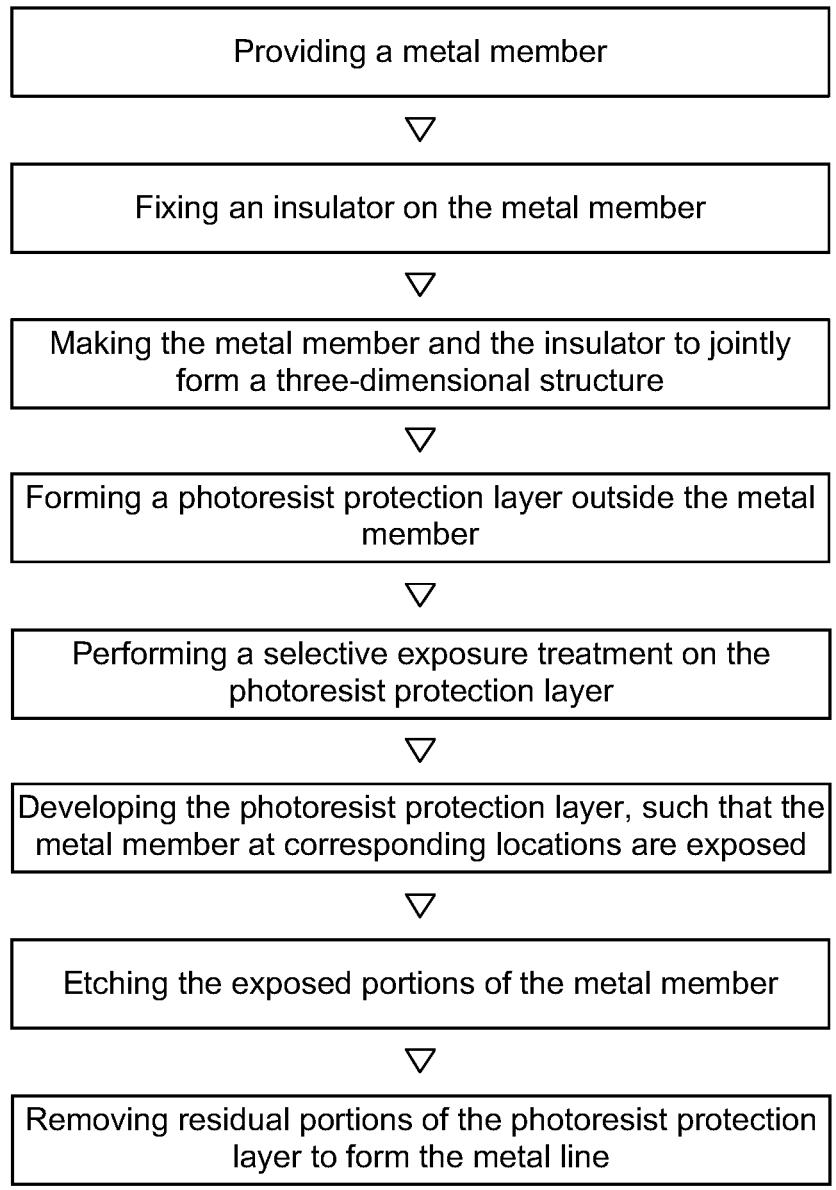
FIG. 17 is a flowchart of a method of manufacturing a curved-surface metal line according to a third embodiment of the present invention.
Figure 18:
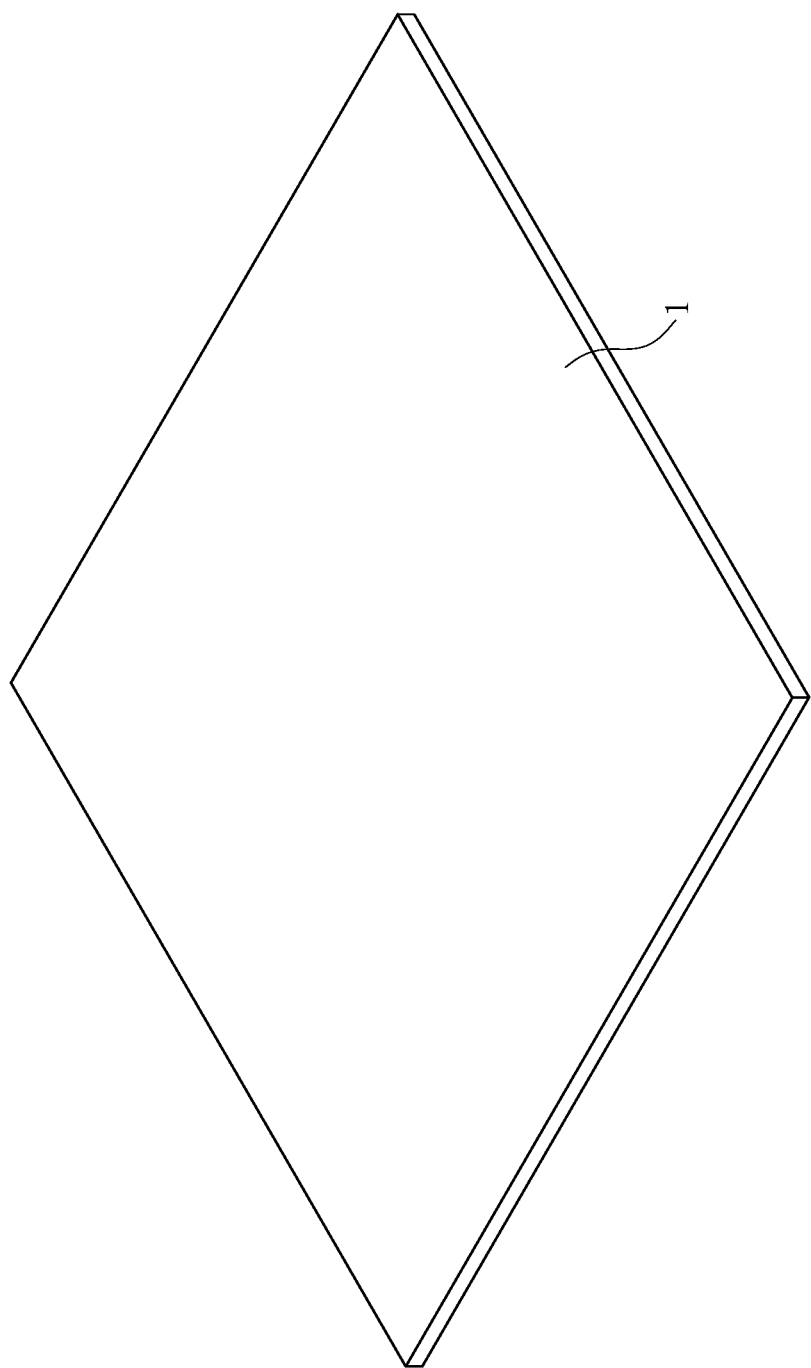
FIG. 18 is a schematic structural view of providing a metal member in the method according to the third embodiment of the present invention.

Referring to the flowchart as shown in FIG. 17 as well as the schematic views of the steps of the method as shown in FIG. 18 to FIG. 20 and FIG. 5 to FIG. 13, a method of manufacturing a curved-surface metal line according to a third embodiment of the present invention includes the following step:

As shown in FIG. 18, in step (1), a metal member 1 is provided.

Figure 19:
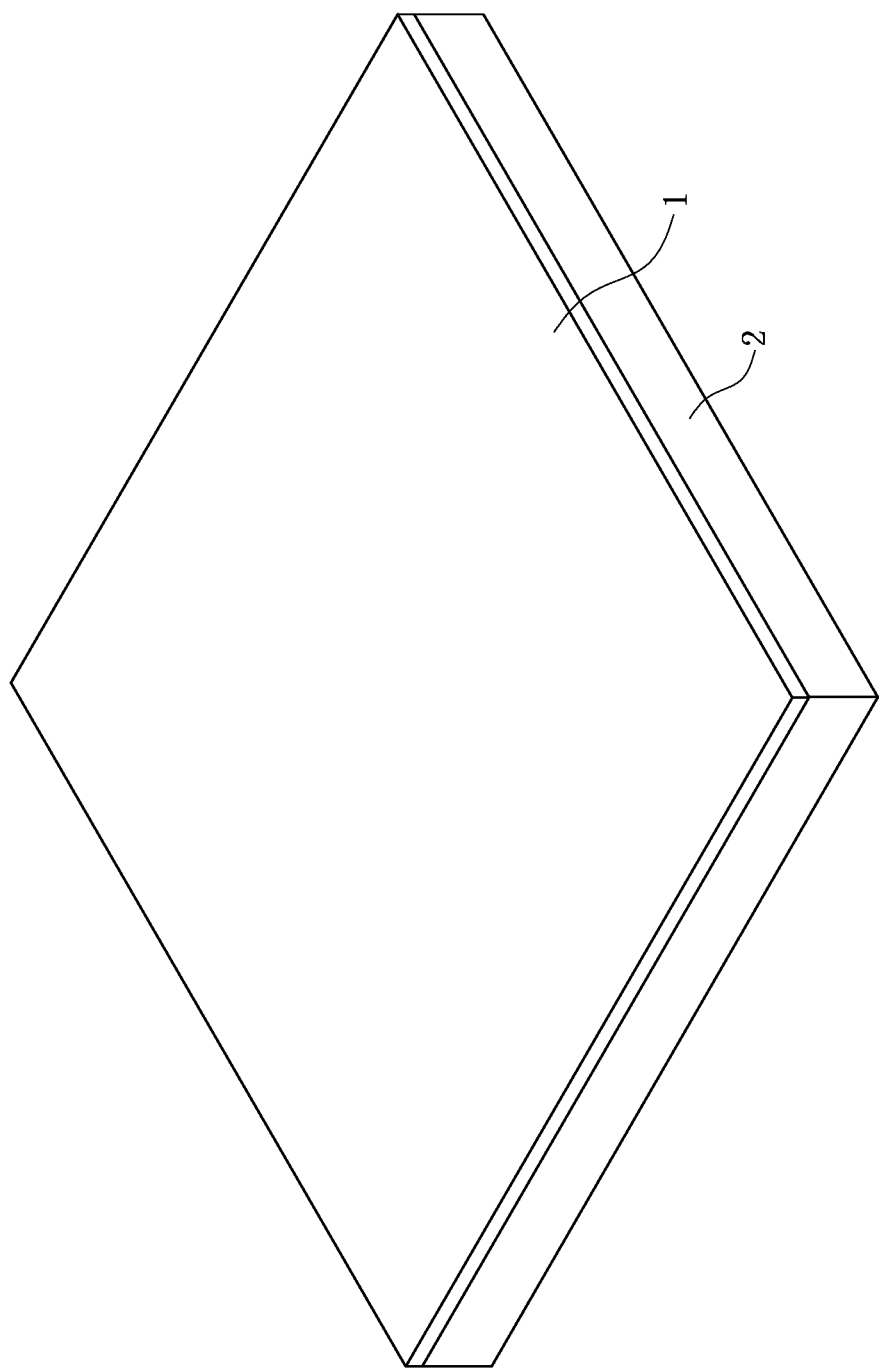
FIG. 19 is a schematic structural view of fixing the metal member and an insulator together in the method according to the third embodiment of the present invention.

As shown in FIG. 19, in step (2), an insulator 2 is fixed to the metal member 1. The insulator 2 can be adhered to the metal member 1 or formed on the metal member 1 by injection-molding.

Figure 20:
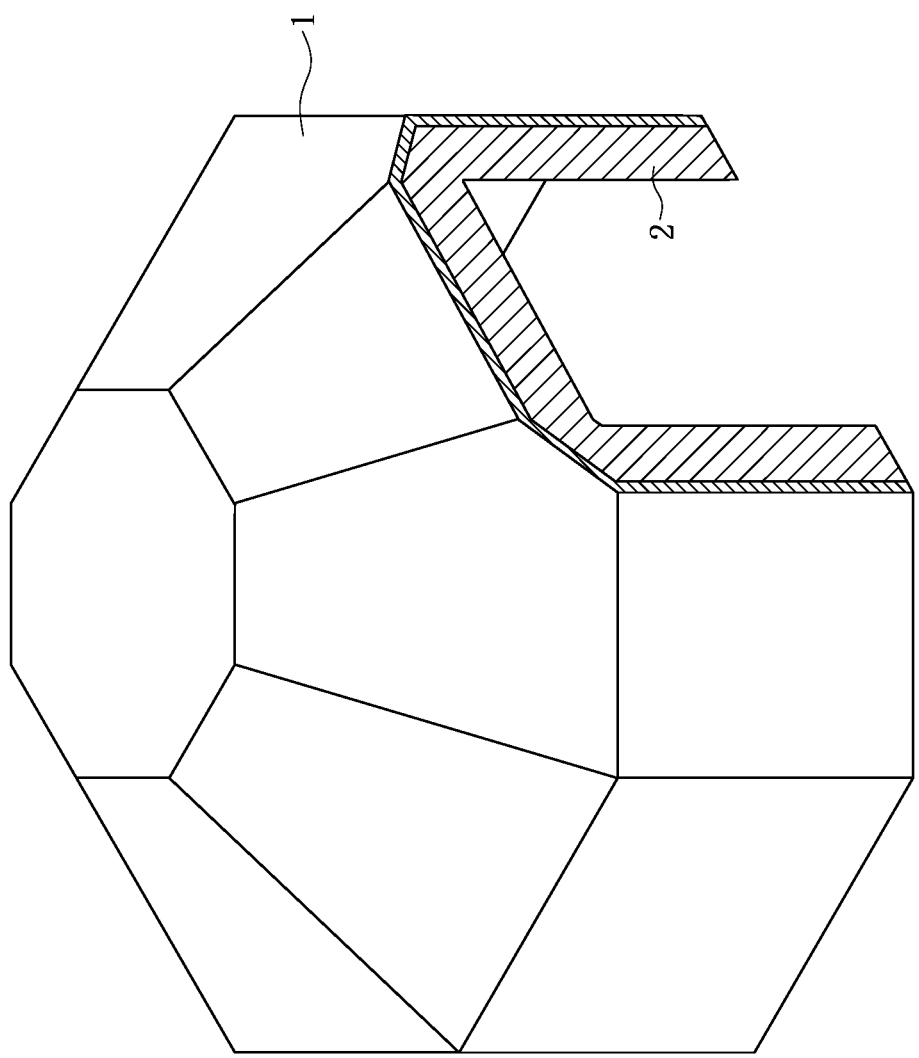
FIG. 20 is a schematic view of jointly forming a three-dimensional structure with the metal member and the insulator in the method according to the third embodiment of the present invention.

As shown in FIG. 20, in step (3), the metal member 1 and the insulator 2 jointly form a three-dimensional structure by stamping or hot pressing.

As shown in FIG. 5, in step (4), a photoresist protection layer 3 is formed outside the metal member 1.

As shown in FIG. 6, in step (5), the photoresist protection layer 3 is performed with to a selective exposure treatment such that corresponding locations of the photoresist protection layer 3 being exposed is subject to a photochemical reaction.

As shown in FIG. 7, in step (6), the photoresist protection layer 3 is developed. After the photoresist protection layer 3 is partially dissolved, portions of the metal member 1 at the corresponding locations of the photoresist protection layer 3 are simultaneously exposed.

As shown in FIG. 8, in step (7), the exposed portions of the metal member 1 are etched.

As shown in FIG. 9 and FIG. 10, in step (8), the residual portions of the photoresist protection layer 3 are removed to form a metal line 4 on the insulator 2.

Other steps of the method which are the same as those in the method according to the first embodiment are not elaborated herein.

To sum up, the method according to certain embodiments of the present invention has the following beneficial effects:

(1) After the metal member 1 and the insulator 2 are fixed together, the metal line 4 is formed on the surface of the insulator 2. Since the metal line 4 is not formed when the metal member 1 and the insulator 2 are fixed together, when the insulator 2 is subject to injection-molding or adhesion, the insulator 2 does not cause impact and pulling on the final metal line 4, and deformation, damage or breakage thereof are thus avoided. Therefore, the metal line 4 being finally manufactured is accurate. Further, the metal member 1 and the insulator 2 are embedded-formed to jointly form the three-dimensional structure, thereby reducing the manufacturing steps.

(2) Since the metal member 1 is firstly fixed on the insulator 2, in the subsequent procedures of manufacturing the metal line 4, the insulator 2 supports the metal member 1, such that the metal member 1 is positioned accurately, and the metal line 4 being finally manufactured has good reliability and high accuracy. Further, the metal member 1 is firstly processed into a specific three-dimensional structure and then embedded-formed with the insulator 2. Thus, the metal member 1 can be processed into different three-dimensional structures according to needs, thereby ensuring the degree of freedom of design of the metal line 4.

(3) The first metal wire 41 and the second metal wire 42 in the three-dimensional structure are electrically connected to the electronic components 5 instead of the traditional circuit board, and conductive lines in different three-dimensional structures can be conveniently designed, such that the space thereof can be saved, and more aesthetical and small products can be produced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method of manufacturing a curved-surface metal line, comprising:
    (1) providing a metal sheet;
    (2) processing the metal sheet to form a three-dimensional structure;
    (3) after forming the three-dimensional structure in the step (2), fixing an insulator to the metal sheet;
    (4) forming a photoresist protection layer on the metal sheet;
    (5) performing a selective exposure treatment on the photoresist protection layer, such that corresponding locations of the photoresist protection layer being exposed is subject to a photochemical reaction;
    (6) developing the photoresist protection layer, wherein after the photoresist protection layer is partially dissolved, portions of the metal sheet at the corresponding locations of the photoresist protection layer are simultaneously exposed;
    (7) etching the exposed portions of the metal sheet; and
    (8) removing residual portions of the photoresist protection layer to form the metal line provided on the insulator.

2. The method according to claim 1, wherein in the steps (1) and (2), the metal sheet is a copper foil, and the metal sheet is formed as the three-dimensional structure by stamping.

3. The method according to claim 1, wherein after the step (8), the metal line has a first metal wire and a second metal wire, the metal line is electrically connected to a plurality of electronic components respectively, and each of the electronic components is connected to the first metal wire and the second metal wire.

4. The method according to claim 1, wherein after the step (8), a shell is formed by being embedded with the metal line and the insulator.

5. A method of manufacturing a curved-surface metal line, comprising:
    (1) providing a metal sheet;
    (2) embedded-forming the metal sheet and an insulator to jointly form a three-dimensional structure;
    (3) forming a photoresist protection layer on the metal sheet;
    (4) performing a selective exposure treatment on the photoresist protection layer, such that corresponding locations of the photoresist protection layer being exposed is subject to a photochemical reaction;
    (5) developing the photoresist protection layer, wherein after the photoresist protection layer is partially dissolved, portions of the metal sheet at the corresponding locations of the photoresist protection layer are simultaneously exposed;
    (6) etching the exposed portions of the metal sheet; and (7) removing residual portions of the photoresist protection layer to form the metal line provided on the insulator.

6. The method according to claim 5, wherein after the step (7), the metal line has a first metal wire and a second metal wire, the metal line is electrically connected to a plurality of electronic components respectively, and each of the electronic components is connected to the first metal wire and the second metal wire.

7. The method according to claim 5, wherein after the step (7), a shell is formed by being embedded with the metal line and the insulator.

8. A method of manufacturing a curved-surface metal line, comprising:
   (1) providing a metal sheet;
   (2) fixing an insulator to the metal sheet;
   (3) after the step (2), making the metal sheet and the insulator to jointly form a three-dimensional structure;
   (4) forming a photoresist protection layer on the metal sheet;
   (5) performing a selective exposure treatment on the photoresist protection layer, such that corresponding locations of the photoresist protection layer being exposed is subject to a photochemical reaction;
   (6) developing the photoresist protection layer, wherein after the photoresist protection layer is partially dissolved, portions of the metal sheet at the corresponding locations of the photoresist protection layer are simultaneously exposed;
   (7) etching the exposed portions of the metal sheet; and
   (8) removing residual portions of the photoresist protection layer to form the metal line provided on the insulator.

9. The method according to claim 8, wherein in the step (2), the insulator is adhered or injection-molded to the metal sheet.

10. The method according to claim 8, wherein in the step (3), the metal sheet and the insulator jointly form the three-dimensional structure by stamping or hot pressing.

11. The method according to claim 8, wherein after the step (8), the metal line has a first metal wire and a second metal wire, the metal line is electrically connected to a plurality of electronic components respectively, and each of the electronic components is connected to the first metal wire and the second metal wire.

12. The method according to claim 8, wherein after the step (8), a shell is formed by being embedded with the metal line and the insulator.

* * * * *